United States Patent [19]

Schlosser

[11] 3,889,204

[45] June 10, 1975

[54] DIGITAL CIRCUIT FOR THE CONTROL OF A VARIABLE FREQUENCY OSCILLATOR

[75] Inventor: Karl Schlosser, Planegg, Germany

[73] Assignee: Siemens Aktiengesellschaft, Berlin & Munich, Germany

[22] Filed: Dec. 15, 1972

[21] Appl. No.: 315,503

[30] Foreign Application Priority Data

Dec. 23, 1971 Germany ............................ 2164175

[52] U.S. Cl. ...................... 331/1 A; 331/10; 331/11; 331/16

[51] Int. Cl. .............................................. H03b 3/04

[58] Field of Search ............ 331/11, 1 A, 10, 16, 40

[56] References Cited

UNITED STATES PATENTS

| | | | |
|---|---|---|---|
| 3,256,493 | 6/1966 | Wu | 331/40 |
| 3,286,191 | 11/1966 | Cornwell | 331/4 |
| 3,458,823 | 7/1969 | Nordahl | 331/1 A |
| 3,514,698 | 5/1970 | Rey | 331/1 A |
| 3,651,422 | 3/1972 | Underhill | 331/14 |
| 3,694,766 | 9/1972 | Boelke | 331/11 |

FOREIGN PATENTS OR APPLICATIONS

| | | | |
|---|---|---|---|
| 1,145,319 | 3/1969 | United Kingdom | 331/11 |

*Primary Examiner*—John Kominski
*Attorney, Agent, or Firm*—Hill, Gross, Simpson, Van Santen, Steadman, Chiara & Simpson

[57] ABSTRACT

A variable frequency oscillator is connected to a counter which is adapted to produce a d.c. voltage, in response to the difference between the frequency of the oscillator and a desired frequency, for controlling the frequency of the oscillator. A frequency discriminator is also connected to the output of the oscillator for deriving a d.c. voltage in proportion to the frequency of the oscillator, and this voltage is mixed with the voltage produced by the counter in order to form a composite signal for controlling the frequency of the oscillator. In this way the frequency of the oscillator is maintained precisely at the desired value.

5 Claims, 1 Drawing Figure

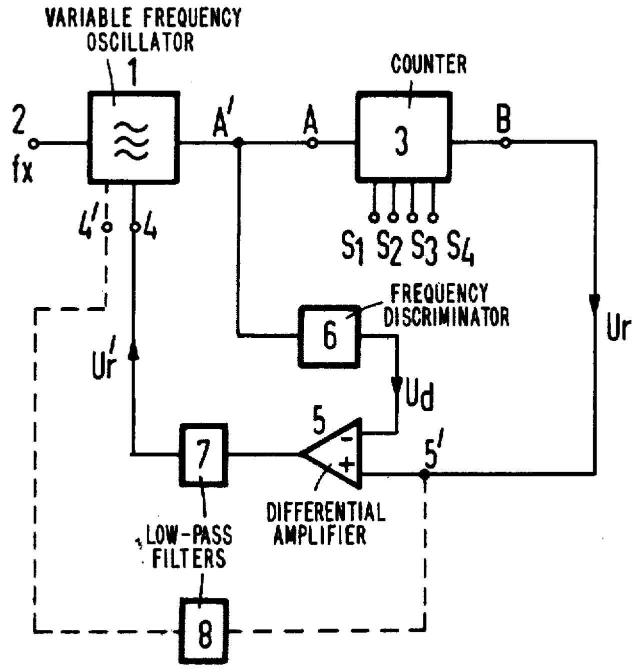
VARIABLE FREQUENCY OSCILLATOR
1
2
fx
A'
A
COUNTER
3
B
S1 S2 S3 S4
4'
4
FREQUENCY DISCRIMINATOR
6
Ur
Ur'
Ud
5
-
+
5'
7
LOW-PASS FILTERS
DIFFERENTIAL AMPLIFIER
8

DIGITAL CIRCUIT FOR THE CONTROL OF A VARIABLE FREQUENCY OSCILLATOR

BACKGROUND OF THE INVENTION

1. Field of the Invention

The present invention relates to digital means for controlling the frequency of a variable frequency oscillator, and more particularly to such apparatus employing a counter for deriving a control signal in response to the difference between the frequency of the oscillator and a desired frequency.

2. The Prior Art

Several digital control circuits have been developed for controlling the frequency of a variable frequency oscillator. In such circuits a counter is used to determine the time period required for the oscillator to produce a predetermined number of pulses, with an analog voltage derived from the difference between such period and the period in which the specified number of cycles is produced when the oscillator is operating at the desired frequency. The analog control voltage derived from the difference between these quantities is used to control the frequency of the oscillator.

In another system, the counter is operative to count cycles of the oscillator only for a predetermined period, and an analog voltage is derived from the difference between the number of cycles of the oscillator during such period and the number of cycles which are produced when the oscillator is operating at the desired frequency.

In both these systems, the control voltage is developed only intermittently, since a predetermined period is required to count the cycles of the oscillator. Accordingly, the frequency of the oscillator may vary about an average frequency, since it is only the average frequency to which the digital systems are sensitive. Thus, the frequency of the oscillator can be modulated about the average frequency, and the digital control system is ineffective to maintain a precisely stable frequency.

Accordingly, it is desirable to provide a control circuit which has the accuracy of digital circuit over the average frequency of the oscillator, but which is also effective to control the instantaneous frequency of the oscillator, to maintain it constant over the period to which the digital control system is sensitive.

SUMMARY OF THE INVENTION

It is a principal object of the present invention to provide apparatus for controlling the instantaneous frequency of a variable frequency oscillator in order to avoid the disadvantages described above.

Another object of the present invention is to provide apparatus in which a voltage is derived as a result of the instantaneous frequency of the oscillator, and in which the frequency of the oscillator is controlled partly in response to such voltage.

These and other objects and advantages of the present invention will become manifest upon an examination of the following description and the accompanying drawings.

In one embodiment of the present invention there is provided a counter associated with a variable frequency oscillator for producing a d.c. voltage in response to the difference between the frequency of the oscillator and the desired frequency, a frequency discriminator connected to the output of the oscillator for developing a d.c. voltage in response to the instantaneous frequency of the oscillator, and means for mixing the two voltages to derive a composite voltage for controlling the frequency of the variable frequency oscillator.

BRIEF DESCRIPTION OF THE DRAWINGS

Reference will now be made to the accompanying drawing which is a functional block diagram of an illustrative embodiment of the present invention.

DESCRIPTION OF THE PREFERRED EMBODIMENT

In the drawing, a variable frequency oscillator 1 is provided with a pair of outputs 2 and A'. The two outputs connect the output of the oscillator 1 to two different locations. Alternatively, the two outputs may be connected together to a single output of the oscillator 1. The frequency of the oscillator 1 is controlled by the voltage level connected to a control input terminal 4.

The output A' of the oscillator 1 is connected to an input A of a counter 3. The counter 3 and the circuit associated therewith are not illustrated in detail, as the construction thereof forms no part of the present invention. The counter 3 and its associated circuitry may be of any construction known in the prior art which is effective to derive a d.c. voltage in response to a digital indication of a difference between the frequency of the oscillator 1 and the desired frequency. Alternatively, the apparatus disclosed and claimed in my copending applications Ser. No. 315,504 and Ser. No. 315,505 filed contemporaniously herewith may be employed. In either event, the counter 3 and the circuitry associated therewith produces at an output B a d.c. voltage $U_r$ proportional to the difference between the frequency of the oscillator 1 and the desired frequency for the oscillator, which is represented by digital signals applied to the input terminals S1-S4 of the counter 3. This voltage is connected to the noninverting input of a differential amplifier 5, the output of which is connected through a low pass filter 7 to the control input terminal 4 of the oscillator 1. The voltage at the output of the low pass filter 7 is designated as $U'_r$, and is related to the d.c. voltage $U_r$ produced at the output terminal B in the counter 3. The control potential $U'_r$ controls the frequency of the oscillator 1 in such a way as to minimize the difference between the desired and actual frequency, and the frequency of the oscillator is thereby adjusted to bring about a constant voltage at the output terminal B.

A frequency discriminator 6 has its input connected to the output A' of the oscillator 1, and produces a d.c. voltage $U_d$ proportional to the frequency of the oscillator 1. The voltage $U_d$ is connected to the inverting input of the differential amplifier 5, so that an increasing frequency of the oscillator 1, which produces an increasing output of the discriminator 6, serves to reduce the output level of the differential amplifier 5, thereby tending to stabilize the frequency of the oscillator 1. The differential amplifier 5 is operative to derive an output which relates both of the inputs $U_r$ and $U_d$, with the result that the value of the d.c. voltage $U'_r$ is a function of both of the d.c. voltages derived by the counter 3 and by the discriminator 6.

In an alternative embodiment, an additional low-pass filter 8 is employed having its input connected to the output terminal B of the counter 3 and its output connected to a control terminal 4′ of the oscillator 1. The effect of a voltage applied to the control terminal 4′ is the same as that produced by a voltage applied to the terminal 4. If the oscillator 1 has only a single input terminal for a control voltage, the signals supplied by the filters 7 and 8 are summed together in a resistor summing network, or the like, and applied to the single control terminal 4 of the oscillator 1. The two low-pass filters 7 and 8 preferably have cut off frequencies which are sufficiently low to block high frequency noise pulses, but high enough to enable the circuit to reset quickly to conditions calling for a change in control voltage.

In an alternative embodiment of the present invention, one or both of the low pass filters may be eliminated. Such an arrangement is satisfactory when the circuits are relatively free of noise.

In operation, the circuit of the present invention derives a voltage from the frequency discriminator 6, as well as a voltage from the counter 3, the latter being in response to the difference between the frequency of the oscillator 1 and the desired frequency therefor. The accuracy and freedom from drift of a control is therefore achieved, and the oscillator frequency is maintained constant by the discriminator circuit during periods of operation of the counter 3.

What is claimed is:

1. In apparatus for controlling the frequency of a variable frequency oscillator including a counter for counting the cycles of said oscillator and producing a first d.c. control voltage in response to the difference between the number of cycles thus counted during a predetermined time interval and the number corresponding to operation of said oscillator at a desired frequency, the combination comprising a frequency discriminator for deriving a second d.c. voltage in response to the instantaneous frequency of said oscillator, and means for simultaneously connecting said first and second control voltages to said variable frequency oscillator for controlling the frequency thereof.

2. Apparatus according to claim 1, wherein said connecting means comprises a differential amplifier, said first control voltage being connected to the noninverting input of said amplifier and said second voltage being connected to the inverting input of said amplifier, and the output of said amplifier being connected with said oscillator.

3. Apparatus according to claim 2, including additional connection means for connecting said first control voltage to said oscillator independently of said differential amplifier.

4. Apparatus according to claim 2, including a low pass filter interconnected between said amplifier and said oscillator.

5. Apparatus according to claim 2, wherein said additional connecting means comprises a low pass filter.

* * * * *